(12) United States Patent
Tracy et al.

(10) Patent No.: US 8,880,369 B2
(45) Date of Patent: Nov. 4, 2014

(54) OCCUPANCY MEASUREMENT AND TRIGGERING IN FREQUENCY DOMAIN BITMAPS

(75) Inventors: Robert E. Tracy, Beaverton, OR (US); Kathryn A. Engholm, Portland, OR (US); Alfred K. Hillman, Jr., Banks, OR (US)

(73) Assignee: Tektronix, Inc., Beaverton, OR (US)

( * ) Notice: Subject to any disclaimer, the term of this patent is extended or adjusted under 35 U.S.C. 154(b) by 1371 days.

(21) Appl. No.: 12/573,026

(22) Filed: Oct. 2, 2009

(65) Prior Publication Data

US 2010/0235124 A1 Sep. 16, 2010

Related U.S. Application Data

(60) Provisional application No. 61/160,216, filed on Mar. 13, 2009.

(51) Int. Cl.
*G01R 23/16* (2006.01)
*G01R 13/02* (2006.01)

(52) U.S. Cl.
CPC ............ *G01R 13/0263* (2013.01); *G01R 23/16* (2013.01)
USPC .......................................................... 702/76

(58) Field of Classification Search
CPC ........................... G01R 13/0263; G01R 23/16
USPC .......................................................... 702/76
See application file for complete search history.

(56) References Cited

U.S. PATENT DOCUMENTS

| | | | |
|---|---|---|---|
| 4,783,803 A * | 11/1988 | Baker et al. | 704/252 |
| 5,574,639 A * | 11/1996 | Qian et al. | 708/300 |
| 6,570,592 B1 | 5/2003 | Sajdak et al. | |
| 2005/0261847 A1 | 11/2005 | Nara | |
| 2007/0282542 A1 | 12/2007 | Duff et al. | |
| 2009/0281839 A1 * | 11/2009 | Lynn et al. | 705/3 |

FOREIGN PATENT DOCUMENTS

| | | |
|---|---|---|
| DE | 10047612 A1 | 8/2001 |
| DE | 102006056151 A1 | 5/2008 |
| DE | 102006056154 A1 | 5/2008 |
| EP | 1755025 A2 | 2/2007 |
| EP | 2058668 A1 | 5/2009 |
| JP | 2005077413 | 3/2005 |
| WO | 2008064769 | 6/2008 |
| WO | 2009143466 A2 | 11/2009 |

OTHER PUBLICATIONS

U.S. Appl. No. 12/611,302, filed Nov. 3, 2009.
U.S. Appl. No. 12/568,141, filed Sep. 28, 2009.

(Continued)

*Primary Examiner* — Tung S Lau
*Assistant Examiner* — Xiuquin Sun
(74) *Attorney, Agent, or Firm* — Christopher S. Tuttle; Michael A. Nelson; Marger Johnson & McCollom PC

(57) ABSTRACT

A method is disclosed for triggering upon signal events occurring in frequency domain signals. The method includes repeatedly sampling a time-varying signal and generating a plurality of digital frequency domain spectrums based on the samples of the time-varying signal. A frequency domain bitmap for the time-varying signal is repeatedly updated via application of the digital frequency domain spectrums. The method further includes selecting a portion of the frequency domain bitmap, determining a signal occupancy in the selected portion, and triggering a capture of the time-varying signal based on and in response to the occupancy determination for the selected portion of the bitmap.

19 Claims, 9 Drawing Sheets

(56) References Cited

OTHER PUBLICATIONS

U.S. Appl. No. 13/039,062, filed Mar. 2, 2011.
U.S. Appl. No. 12/790,403, filed May 28, 2010.
Anonymous: "DPX Acquisition Technology for Spectrum Analyzers Fundamentals;" Tektronix, 2008, pp. 1-20.
Anonymous: "Fundamentals of Real-Time Spectrum Analysis", Jan. 1, 2008, pp. 1-52, XP002668787, URL: http://www.tektronix-resources.com/0803pulsedrf/fundamentals_spectrumanalysis.pdf, retrieved on Jan. 2, 2012.
Hill: "Real-Time Spectrum Analysis Reveals Time Domain Characteristics of Frequency Domain Signals", ARFTG Microwave Measurement Symposium, 2008 72ND, IEEE, Piscataway, NJ, USA, Dec. 9, 2008, pp. 102-108.
European Search Report for Application No. 10156403.7, prepared Sep. 13, 2013, 4 pages.

* cited by examiner

OCCUPANCY MEASUREMENT AND TRIGGERING IN FREQUENCY DOMAIN BITMAPS

CROSS-REFERENCE TO RELATED APPLICATION(S)

This application claims priority from U.S. Provisional Patent Application No. 61/160,216, entitled "Frequency Domain Bitmap Triggering with Automatic Generation of Trigger Criteria," filed Mar. 13, 2009, the disclosure of which is hereby incorporated by reference in its entirety and for all purposes.

BACKGROUND

Test and measurement operations are often controlled using triggering methods. For example, in the above case of discovering and capturing signal events for subsequent study, signal captures can be based on a trigger that is activated when certain signal characteristics are observed or otherwise detected. Use of such a trigger conserves computing resources by only capturing signals that may potentially be of interest.

Although existing triggers are adequate in many cases, a variety of common signal situations exist that cannot be effectively detected by existing triggers. In addition, many existing triggering methods are imprecise, and limit the ability of the user to particularly specify signal events of interest.

SUMMARY

A method is provided for triggering upon signal events occurring in frequency domain signals, such as signals processed through an test and measurement device or signals processed and analyzed by software or other instructions. The method includes repeatedly sampling a time-varying signal and generating a plurality of digital frequency domain spectrums based on the samples of the time-varying signal. A frequency domain bitmap for the time-varying signal is repeatedly updated via application of the digital frequency domain spectrums. The method further includes selecting a portion of the frequency domain bitmap, determining a signal occupancy in the selected portion, and triggering a capture of the time-varying signal based on and in response to the occupancy determination for the selected portion of the bitmap.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

Figure 1:
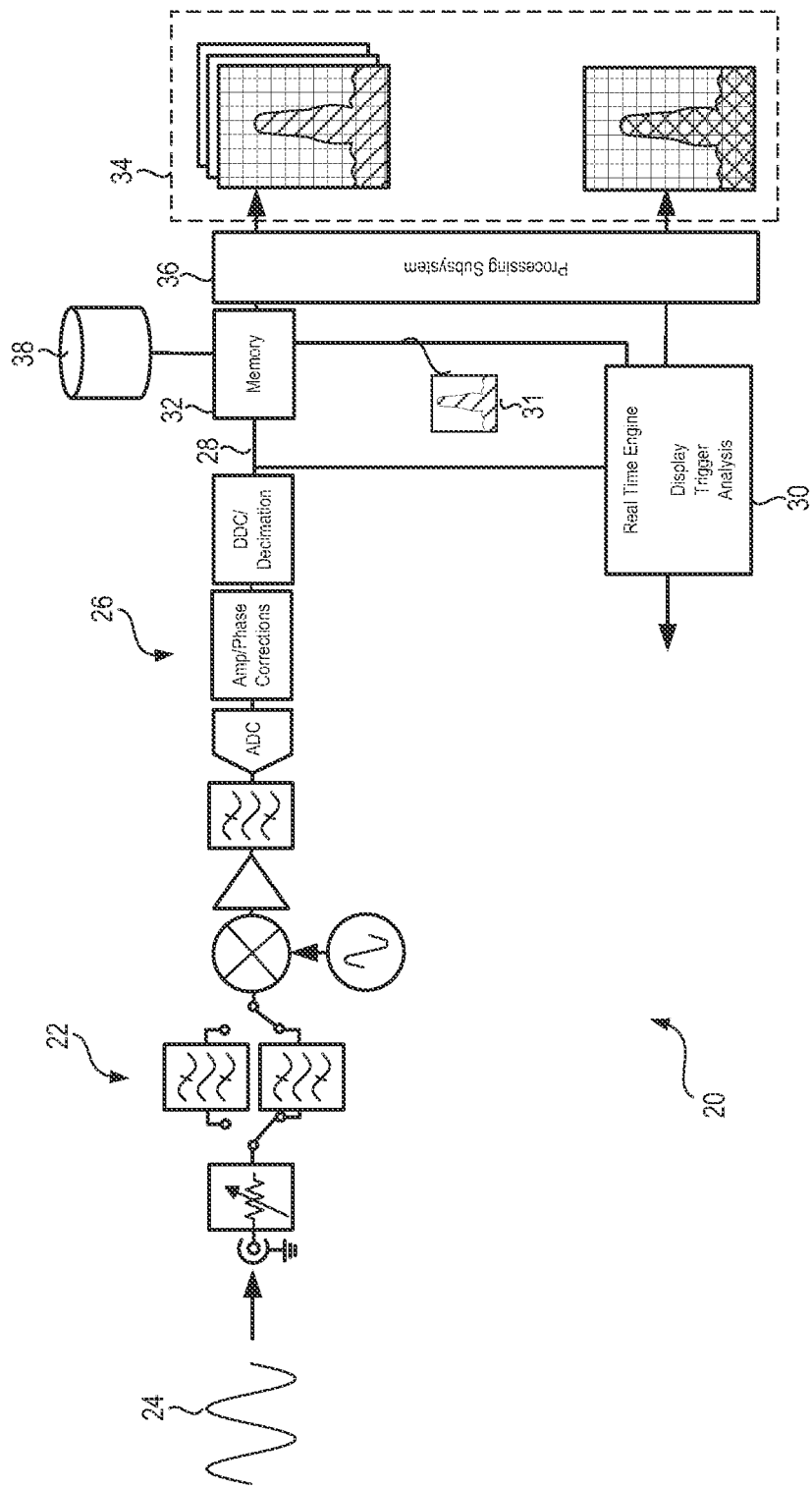
FIG. 1 is a schematic depiction of a test and measurement device and system according to the present description.

Referring now to FIG. 1, the figure depicts a signal measuring and testing system 20 according to the present description. System 20 includes a front end 22 for receiving a time-varying signal 24 and for optionally performing various processing operations on the incoming signal. Optional processing may include filtering, mixing, down-conversion, etc. As indicated, additional components 26 may be employed to convert the incoming signal into digital form, and to perform decimation operations and/or make phase and amplitude corrections. The depicted configuration is exemplary, and those skilled in the art will appreciate that a variety of other arrangements may be employed.

At node 28 in the signal path, the signal(s) exists as a digitally processed version of time-varying signal 24. This, in turn is applied to real-time engine processing block 30. Among other things, block 30 is configured to repeatedly generate digital frequency domain spectrums 31 based on the time-varying signal 24. Spectrum generation may be performed using any number of digital frequency transform techniques, including chirp-z, FFT and variable-length FFT.

System 20 also includes a memory subsystem 32, which is operatively coupled (e.g., via a bus) with the front-end blocks and the real time block 30. Furthermore, system 20 typically also includes a display subsystem 34 and a processing subsystem 36. As discussed further below, memory subsystem 32 may provide a data store containing a frequency domain bitmap constructed from spectrums 31. System 20 may also include physically or logically separate storage location 38, which may be employed for storage of signals that will be subjected to detailed offline analysis. Memory subsystem 32 and storage location 38 may form portions of a storage subsystem, which may include one or more components in addition to those in the depicted example.

Generally, memory subsystem 32 is configured to provide memory space for supporting real-time functionality of system 20. For example, a portion of time-varying signal 24 typically is retained in memory while frequency domain transformation and other real-time operations are performed at block 30. One reason for the retention is to enable a portion of the time-varying signal to be captured and analyzed more extensively offline, for example using processing operations that are more intensive and resource-consumptive than could be performed during real time processing. Setting aside a portion of the time-varying signal in this manner may be referred to as an "analysis capture." Such a set-aside typically is done in response to detection of a triggering event, as will be explained in more detail below.

By combining real-time processing with selectively-triggered offline processing, measurement and test operations can be made more efficient, and scarce computing resources are used only when needed. In one sense, the real time block 30 operates as a screening tool for making decisions about when a more comprehensive analysis should be performed, and on what specific data it should be performed on. Furthermore, triggering can provide substantial efficiency for users, by eliminating trial and error associated with capturing data of interest, and/or by eliminating the need to capture and sift through large amounts of raw or processed data to find signals of interest.

Figure 2:
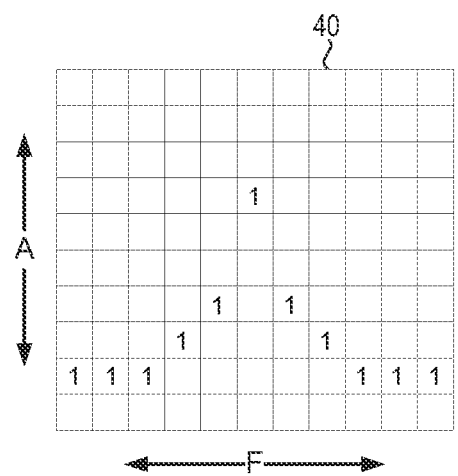
FIGS. 2 and 3 are schematic depictions of exemplary frequency spectrum bitmaps.

Turning now to FIG. 2, storage of frequency domain information will be discussed. In particular, in many of the examples herein, frequency domain data is stored in a bitmap structure 40, in which quantized amplitude or power level information is expressed as a function of frequency. Typically, information from a plurality of the digital frequency domain spectrums 31 will be accumulated into the bitmap data structure. Indeed, in many example embodiments, the bitmap structure 40 is updated and incremented through repeated successive application of the digital frequency domain spectrums as they are generated by block 30.

The bitmap typically is generated using a high transform rate, which is desirable in many settings to facilitate detection of infrequent events. Though desirable for event detection, the high rate will often be too fast for the display device or devices used in connection with subsystem 34 to display the bitmap data, and will normally be well beyond what human eyes can perceive. Accordingly, the incoming transforms are written into the database at full speed and then transferred to the screen at a viewable rate. For example, the display may be driven by sampling the database 10, 20, 30 or 60 times a second. These are but examples—other frame rates may be employed.

As demonstrated by the bitmap figures herein, the bitmap structure may be thought of as a grid created by dividing a spectrum graph into rows representing trace amplitude or power values and columns for points or ranges on the frequency axis. Each cell in the grid contains a count of how many times it was hit by an incoming spectrum. By tracking and applying a visual coding to these counts (e.g., a mapping of count values to intensity or hue), the system allows the user to visually distinguish rare transients from normal signals and background noise. The reader will appreciate that the bitmap figures herein provide simplified demonstrative examples, and that the actual embodiment of the database(s) stored in memory subsystem 32 will likely contain hundreds of columns and rows.

Figure 3:
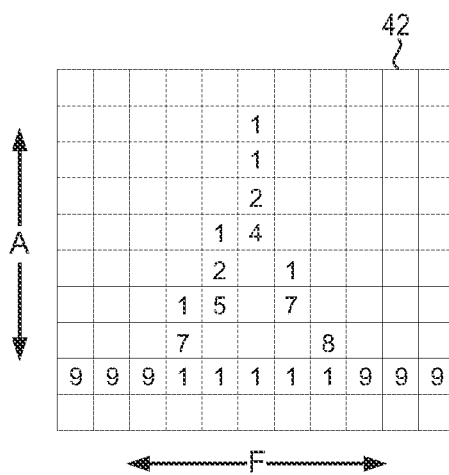

Comparison of FIG. 2 and FIG. 3 shows the relationship between a single digital domain frequency transform and the accumulation of many such transforms into the bitmap database. No accumulation has occurred with respect to FIG. 2—it shows a bitmap representation of a single frequency transform, and indicates the amplitude/power level of the transform for each frequency in the range of interest. More specifically, FIG. 2 shows what the bitmap cells might contain after a single spectrum is mapped into it. Blank cells contain the value zero, meaning that no points from a spectrum have fallen into them yet.

Over time, however, when different samples are taken of the time-varying signal, the individual frequency spectrums will vary and yield different values of frequency and amplitude. The bitmap representation 42 of FIG. 3 shows a bitmap that has been updated (incremented) by applying and storing nine different digital frequency domain transformations in the bitmap. More particularly, the bitmap of FIG. 3 includes the data from the spectrum shown in FIG. 2, but with eight additional spectrums added. The nature of the spectrums applied to the bitmap is that, for each spectrum, some amplitude/power value is indicated for each value along the frequency axis, even if it is a noise floor or other baseline value, or even a value set aside to represent "invalid point". Indeed, in the example of FIG. 3, one of the spectrums was generated while the incoming time-varying signal was absent, as reflected by the string of "1" values at the noise floor.

In some cases it will be desirable to map occurrence values to a color scale, in order to provide an enhanced visual representation of the data. For example, the following color mapping could be used for the nine-spectrum example described above:

| Number of Occurrences | Color |
|---|---|
| 0 | Black |
| 1 | Blue |
| 2 | Light blue |
| 3 | Cyan |
| 4 | Green blue |
| 5 | Green |
| 6 | Yellow |
| 7 | Orange |
| 8 | Red orange |
| 9 | Red |

In this example, warmer colors such as red, orange etc. are used to indicate higher numbers of occurrences. This is but an example—a variety of other intensity-grading schemes can be used.

Bitmap hit counts typically are accumulated over time. Because the rate at which spectrums arrive is faster than the display system typically can handle, a "frame" of spectrums (e.g., thousands of spectrums) is accumulated into the bitmap before the next operations are performed on the bitmap. For example, in one embodiment, 48,000 spectrums are applied to the bitmap database each second. Using a frame rate of approximately 33 times per second, the result is that approximately 1400 spectrums are applied to the bitmap database during each display frame. In another embodiment, 292,000 transforms per second are generated, and a 20 Hz frame rate is employed, such that approximately 15,000 spectrums are applied to the bitmap per display frame.

In any case, after a frame has been completed and its count data sent along to the next process, its count values can either be discarded or not. Maintaining the count values from one frame to the next may be referred to as persistence. When persistence is employed, existing counts in the bitmap database are maintained and the power/frequency values of the newly-arriving spectrums are added to increment the counts, rather than simply restarting the counts and replacing them with the values from the most recent frame.

Different types or degrees of persistence may be employed in connection with the storage and display of bitmapped spectrum data. For example, "infinite persistence" refers to maintaining the full accumulated count from each frame to the next, with each succeeding frame adding to the existing counts. On the other hand, "variable persistence" refers to maintaining less than the full count, which can be implemented in various ways, such as by reducing the count by a fixed fraction for each successive display frame.

One situation illustrating persistence and its potential utility is an anomalous signal arising only once during a period of observation. Assume that this signal, although present only once, was present for all 1465 of the spectrum updates in a frame. Assume further that a variable persistence scheme is employed in which the bitmap counts are decremented by 25% each frame. In this example, the affected cells in the bitmap would start out with a value of 1465 and would be displayed full-force when the bitmap database was sampled for display of that initial frame. One frame later, the occurrence values in the affected cells would be decremented by 25% to 1099. Another frame later, they would be decremented to 824, and then smaller and smaller until they become so dim as to be invisible. On the screen, a bright trace would be displayed initially with a spike at the signal frequency. As successive frames are transferred to the display, the part of the displayed spectrum where the signal occurred would diminish (e.g., by fading and/or changing to colors indicating lower density). Meanwhile, the pixels at the noise level would start to brighten below the fading signal. In the end, only a baseline trace would exist at the noise floor.

The spectrum measurement systems and methods described above can provide numerous advantages in a variety of settings. Samples from the time-varying signal are converted into spectrum traces at a high rate so that there is little or no dead time between waveform updates. Furthermore, the spectrum traces are fed to a bitmap database that can be implemented with adjustable parameters to boost the visibility of signal events. As described above, persistence may be implemented in various ways, and the waveform prevalence in different portions of the spectrum may be reflected in the display using various intensity grading and color schemes in connection with the bitmap.

The reader will appreciate that the principles of the present discussion can be extended to accommodate analog frequency domain spectrums. In such a case, the analog spectrums could be sampled and processed so as to produce repeated update of a bitmap data structure. Though the particulars of such a scheme might vary, the general effect would be to provide digitized versions of the analog spectrums. Thus, for purposes of the present discussion, the analog spectrums would yield a plurality of digital frequency domain spectrums (through conversion) that would be repeatedly applied to update the bitmap database.

In many cases it will be desirable not only to observe a particular signal event or events, but also to perform a detailed analysis of the event and/or of neighboring regions of the time-varying signal. A variety of triggering methods exist, including various types of external and internal triggers, including level triggering, power triggers, frequency mask triggers and the like. To analyze transients and other infrequent signal events, it is often useful to employ some form of internal trigger, in which the triggering is performed in response to some characteristic of the signal being observed.

In any case, once a trigger is declared, an analysis capture of the time-varying signal is taken using various acquisition settings, such as capture length, delay, etc. Although the existing triggers are adequate for a fairly wide variety of signals, there is a signal situation that is relative common in digital RF systems for which none of the existing internals triggering methods work. For example, in a given frequency range, signals may occur at a variety of different power/amplitude levels at different times. A power trigger can catch signals with the highest power, frequency mask triggers can catch signals that exceed some power threshold at a specific frequency, but the "signal under signal" scenario remains elusive.

Figure 4:
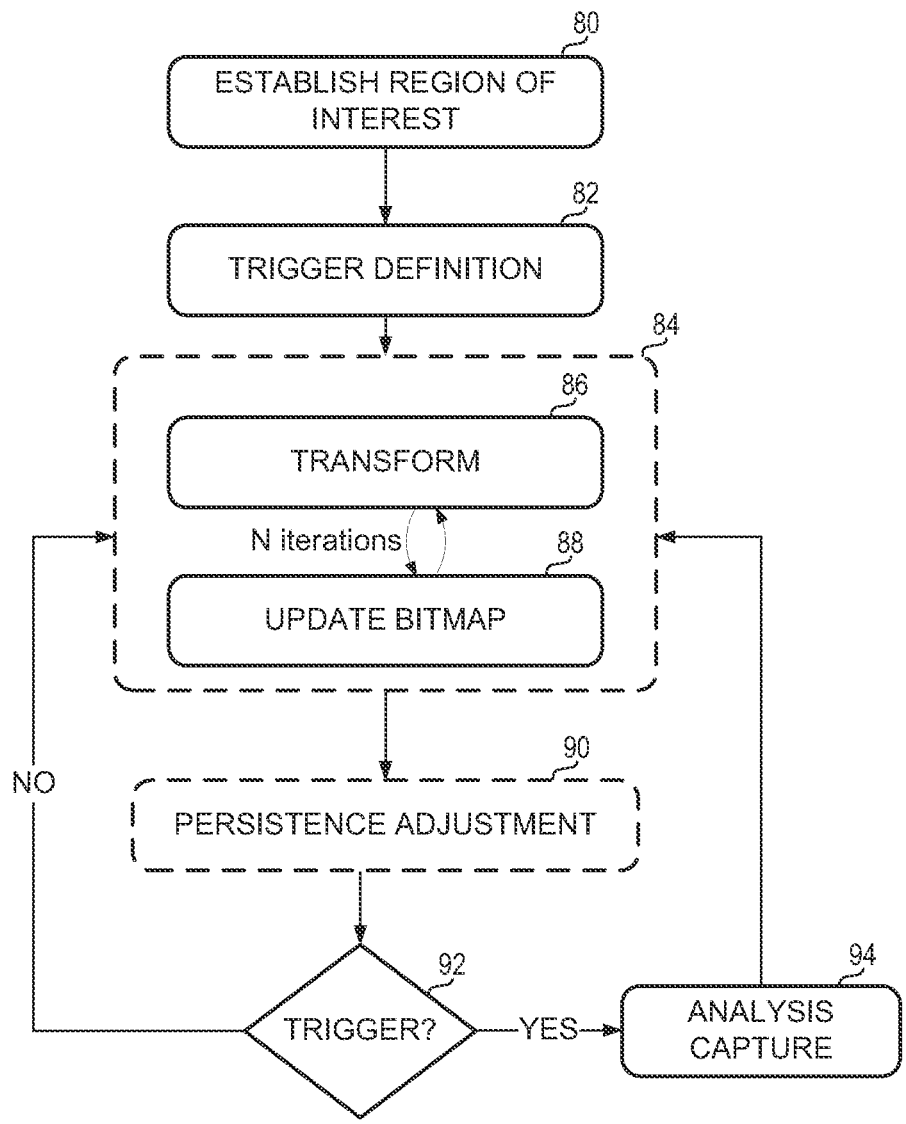
FIG. 4 shows an exemplary method for maintaining a frequency spectrum bitmap and performing triggers in response to bitmap data.

The bitmap and display persistence described herein may be used to construct trigger mechanisms to overcome the detection problem described above and/or to provide other utility and advantages. Referring now to FIG. 4, an exemplary triggering method will be described.

As shown at 80, the method may first include establishing a region of interest. Typically, this region will be established in association with the bitmap data structure described above. For example, a specific grouping of pixels or other portion of the bitmap may be specified as the region of interest. Typically the grouping will be a rectangular region of bitmap cells that are used to drive pixels on the display, though other groupings may be employed.

Generally, some form of user input is received in order to establish the region of interest. For example, a keyboard may be used to specify X and Y ranges of interest corresponding to amplitude and frequency ranges to be observed. Alternatively, graphical methods may be employed, such as receiving a mouse input or other input used to draw a box on a display of the bitmap.

As shown at 82, the method also includes establishing the triggering criteria to be employed. In the examples discussed herein, the trigger is internal and the searched-for characteristics of the signal are specified as or translatable into bitmap data occurring in the region of interest. Specific examples that will be discussed in more detail below include triggers based on intensity grading or color values in the bitmap, and triggers based on signal occupancy and signal correlation.

Steps 86, 88, and 90 relate to the iterative operation of the system that occurs following specification of the region of interest and triggering criteria. Steps 86 and 88 depict the repeated generation of digital frequency domain transforms, and the application of those transforms to update the bitmap database. In one embodiment, the trigger criteria are tested for every transform applied to update the bitmap database. In another possible embodiment, the triggering criteria are assessed only once per display frame, or only once every n transforms, rather than upon every individual transform update to the bitmap database. Accordingly, in the depicted example, the bitmap database is updated N times, where N is the number of transforms per display frame, before processing flow moves on to the testing for satisfaction of the triggering criteria. It should be appreciated, however, that the triggering criteria may be tested on any desired schedule, including at intervals that do not coincide with the display frame rate of the device. That said, it will often be desirable to match the testing to the sampling of the database for display purposes, since the triggering events are often understood by the user in terms of signal phenomena that are visible on the display, either directly or through enhancements provided by persistence, color coding and other features. In other settings, however, time resolution requirements may dictate a preference for applying the test for every transform update to the bitmap.

As seen at 92, after a frame's worth of transforms have been accumulated into the bitmap structure, processing flow moves on to testing of the triggering criteria. Prior to testing of the trigger, however, the accumulated values in the bitmap may be decreased or decayed according to the particular persistence regime being employed, as shown at 90. On the other hand, it will at times be desirable to conduct the trigger test prior to application of any decay or persistence techniques. For example, it may be preferable to perform occupancy triggering on bitmap data prior to adding persistence, or to perform the density test on persisted bitmaps that have been or cleaned to factor out persistence effects. Further examples of compensating for persistence effects will be discussed below.

Continuing with the figure, if a trigger is not declared, processing flow returns to 84, where another frame's worth of transforms are applied to the bitmap prior to the next testing cycles, and so on. On the other hand, as shown at 94, an analysis capture of the time-varying signal is performed if the screening analysis on the region of interest results in a trigger declaration. As previously described, analysis capture typically will involve storage of a desired portion of the time-varying signal in a logically or physically separate location, to allow the captured data to be subjected to a deeper, more comprehensive analysis. As previously described, various acquisition settings may be employed to specify exactly what portion of the time-varying signal is captured when a trigger is declared. Two specifications that are often employed are a specification of the length (in time) of the portion of the time-varying signal that is to be retained for deeper analysis, and an indication of where in time the beginning of the sample should occur, relative to the moment of the trigger event. Furthermore, it will be appreciated that portions of the time-varying signal occurring before and/or after the trigger declaration may be included in the analysis capture that is retained in memory subsystem 32.

Another potentially desirable result of recognizing a trigger is enabling a clear display/output of trigger events. For example, a user may optionally set the display to update only upon a trigger event. In such a case, it may be easier to see events of interest because display frames of spectrums that don't contain trigger events are suppressed and therefore won't clutter up the display or otherwise obscure the event of interest.

Turning now to particular examples of trigger specification, one class of trigger specifications may be constructed using color characteristics of the bitmap. It should be appreciated that when a trigger is specified in terms of color, the triggering will thus be dependent upon the intensity grading or color schemes that are used in connection with displaying samples of the bitmap structure (e.g., on display subsystem 34). The color criteria may be defined in various ways for the specified area of interest. For example, the triggering criteria might be that a certain percentage of the pixels in the area must be "at least" green, that is green or a color corresponding to a relatively higher number of waveform occurrences. As another example, the criteria might be an "average" color for all the pixels (bitmap cells) in the defined area. These are but examples—other color-based criteria may be employed. Furthermore, the specification occurring at 82 (FIG. 4) may be expressed directly through inputs from the user, or may be derived or calculated from user inputs.

Typically, as discussed above, the trigger test is performed once for every display frame sent to display subsystem 34. For example, in one of the previously-described embodiments, the system was updated with approximately 48,000 transforms every second, and a 33 Hz frame rate was employed. In this example, the trigger criteria would be tested for approximately once for every 1400 transforms applied to the bitmap.

Referring to the determination step 92 of FIG. 4, the determination process typically will involve a pixel-by-pixel check of the region of interest that is defined at step 80. If the color-based criteria are satisfied, triggering occurs and a capture analysis is taken, as shown at 94.

Figure 5:
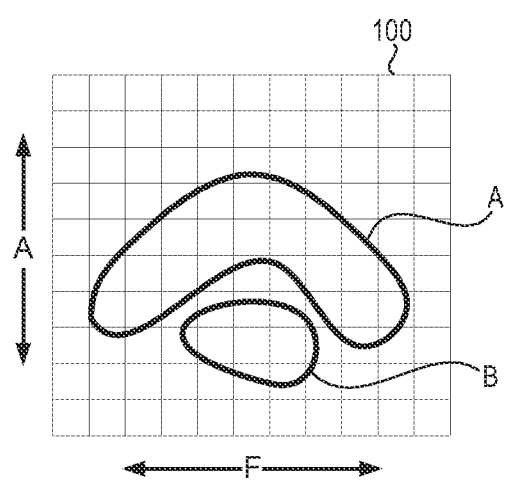
FIG. 5 shows an exemplary frequency spectrum bitmap, including two different regions which may experience different signal occupancy.

Triggering may also be predicated on waveform occupancy, also referred to as density or prevalence, with respect to the defined region of interest in the bitmap. Stated another way, a user may be interested in the relative rate at which a time-varying signal generates frequency spectrum components in a particular power-frequency region of the spectrum. Referring to FIG. 5, an exemplary frequency-power bitmap spectrum 100 is shown. Assume, for example, that the user expects a "healthy" signal to primarily or exclusively generate components in Region A, with occasional artifacts occurring in Region B. The user may be unconcerned with such artifacts, provided they occur infrequently. Accordingly, the user could define an occupancy threshold, which would result in a trigger (and analysis capture) in the event of increased activity in Region B. From this example, it should be understood that the present systems and methods can be used advantageously to detect spectral events even when they are "surrounded" on the spectral representation by signals of both higher and lower amplitudes, and by signals of greater and lesser prevalence. Furthermore, in many cases a useful trigger can be devised without any prior knowledge of the signal of interest's wave shape in either the time or frequency domain. Accordingly, the method of FIG. 4 and in particular the trigger definition at step 82 may be adapted so that triggering is performed based on signal occupancy.

Figure 6:
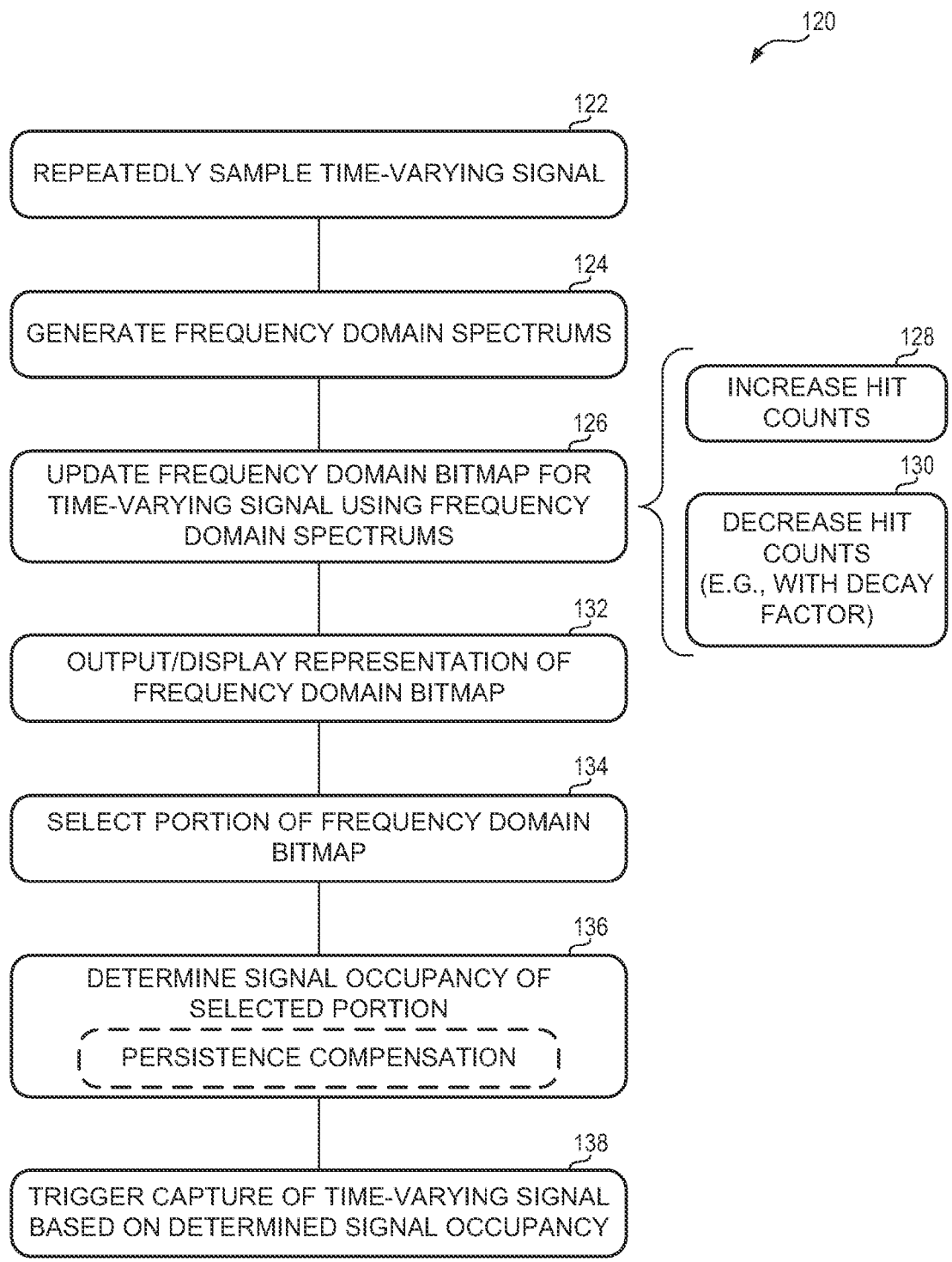
FIG. 6 shows an exemplary method of triggering upon signal occupancy.

FIG. 6 depicts an exemplary method 120 for triggering upon signal events occurring in frequency domain signals, and provides a further example of occupancy-based measurement and triggering. The method may be employed in connection with an frequency domain test and measurement device or system, such as that depicted with reference to FIG. 1, though this is merely exemplary and it should be understood that the method may be employed in connection with other devices and systems. As in some of the previous examples, the exemplary method may include repeatedly sampling a time-varying signal and using frequency domain transforms derived from the signal to update a frequency domain bitmap, as shown at steps 122, 124 and 126.

The updating of the frequency domain bitmap (step 126) may include increasing and decreasing hit counts in the bitmap, as respectively shown at steps 128 and 130. The method may also include, at step 132, outputting and/or displaying a displayable representation of the frequency domain bitmap (e.g., on display subsystem 34 of FIG. 1). When frequency domain spectrums are applied, hit counts are increased in portions of the bitmap if the applied spectrum(s) includes components corresponding to the amplitude and frequency values encompassed by those respective portions of the bitmap. On the other hand, accumulated hit counts may be decreased, as previously explained, to provide varying levels of finite persistence. Typically, persistence is employed to achieve display persistence on a displayed representation of the bitmap (e.g., an output on a monitor or other display device), and is implemented by periodically decreasing accumulated hit counts in the bitmap with a decay factor. As described above, display persistence can provide an effect whereby a transient signal event occurring in one display frame is displayed over one or more successive display frames, but is attenuated over time. For example, a frame-to-frame decay factor of 0.1 would mean that only 10% of the accumulated hit count in a portion of the bitmap would be carried over to drive the display in the next successive frame. Attenuation on the display may entail a fading of the signal, a change in color, or other visual changes to reflect or indicate the aging of the corresponding signal event.

As shown at 134, the method may also include selecting a portion of the frequency domain bitmap. Then, at step 136, the method may include determining the signal occupancy of the selected portion of the frequency domain bitmap. At step 138, a capture of the time-varying signal may be performed based on the occupancy determination for the selected portion.

Occupancy values may be determined at step 136 in a variety of ways. In one implementation, occupancy is defined as the number of bitmap cell hits occurring in the selected portion/region, divided by the number of hits that would have occurred if all the transforms from the respective observation period had fallen into the defined portion/region. For example, assume the region of interest defined at step 80 (FIG. 4) or step 134 as being at frequency F, between amplitude levels $A_{upper}$ and $A_{lower}$. Assume further that 100 spectrums are applied to the bitmap database during the observation interval. If 85 of the spectrums generate an amplitude level between $A_{upper}$ and $A_{lower}$ for frequency F, then the density would be 85/100=0.85, using this measure. If the region of interest were to span a range of frequencies, for example so that it was i cells wide, then that factor would have to be accounted for in the denominator. The resulting calculation would involve dividing the number of occurrences in the region by (100×i) for an average occupancy.

Further exemplary equations for determining occupancy are set forth below. As the exemplary equations below show, occupancy may be expressed or derived in terms of time in which signals are present, in addition to or instead of the above example based on hit counts. More particularly, occupancy may be determined by taking an amount of time a signal is present in a region of the bitmap, and dividing that time by the total time of the measurement period. Alternatively, using hit counts, occupancy may be determined by taking an actual number of hits occurring within a portion of the bitmap during a measurement period, and dividing that number by a maximum number of hits that could have occurred if full occupancy were to have occurred during the measurement period. Both approaches are reflected in the following exemplary occupancy equations:

Let:
Ts=Time signal is present;
Tm=Total time of measurement;
Tt=Time covered by the data series for a frequency domain transform;
N=number of transforms during the measurement period; and
Z=z-axis value of a pixel in the bitmap=number of times pixel was hit by a waveform;
Then:

Occupancy=($Ts/Tm$)×100 (expressed as percentage);

$Ts=Z\times Tt$ (this example is for a single pixel);

$Tm=N\times Tt$; and

Occupancy=($Z\times Tt\times 100$)/($N\times Tt$)=100×($Z/N$)

To compute Ts for an area of interest including more than one pixel, for each column in the bitmap that contains more than one of the pixels of interest, the z values of each pixel of interest are summed together to provide a total Z value. The maximum Z value from amongst all the affected columns is used to compute occupancy. The denominator, N, is not affected by the size of the area of interest.

The occupancy measurement can be computed continuously, such that the measurement is updated after each new transform is applied to update the bitmap. It can also be computed repeatedly, or periodically, after each x number of transforms, as long as the number of transforms is sufficient to provide desired statistical results.

Computing the occupancy continuously or repeatedly allows the instrument to monitor the input signal for the presence of signals in the area of interest that exceed an adjustable threshold for occupancy value. This occupancy trigger can be used to halt the instrument's acquisition/analysis cycle or initiate any number of instrument activities, including but not limited to saving data (e.g., performing an "analysis capture") and performing measurements. The occupancy trigger can be configured to detect the absence of a signal from the area of interest, or even just a relatively small increase or decrease in occupancy.

Variants of the compound Z and occupancy values may be determined to provide supplemental information about the area of interest. For example, the average occupancy over a range of frequencies may be assessed, or the maximum or average occupancy across a set of discrete amplitude ranges. As another example, a user may set a specific measurement period or start and stop times. As another example, the measurements may be performed repeatedly, and each repetition may have the same duration, then statistical calculations such as Average, Max, etc. may be performed on the occupancy result.

Furthermore, the occupancy of a signal that is superimposed upon a background of other signals may be measured. To measure the occupancy of just the signal of interest, a reference occupancy may be designated (e.g., by a user pointing to an area of background color or indicating an area of the display containing the reference (background) signals). The background area's occupancy may be measured and subtracted from the occupancy value computed for the signal of interest. The remainder value may represent the occupancy due only to the signal of interest.

Regardless of how the occupancy is determined, various triggers may be implemented based on the determined occupancy. For example an occupancy trigger may be based on (1) occupancy exceeding a threshold; (2) occupancy falling below a threshold; (3) average occupancy over a range of frequencies exceeding or falling below a threshold; and/or (4) maximum or average occupancies over a set of discrete amplitude ranges having certain values or crossing defined threshold values. These are but a few non-limiting examples.

Referring again to step 136, the occupancy measurements may vary based on persistence. Finite persistence, sometimes called "Variable Persistence", modifies the pixel z-axis values (bitmap hit counts) by periodically reducing them by an adjustable factor, sometimes referred to herein as the decay factor. Infinite persistence never clears the z-axis values, so even if a signal is no longer being received, it continues to be represented in the bitmap database, and potentially in the displayed representation of the bitmap. Persistence stretches the amount of time a signal is visible in the displayed representation of the bitmap (e.g., the displayed graph), and may affect hit counts. If the occupancy measurement is computed using the version of the bitmap database that has already been modified by persistence (e.g., with a decay factor applied successively to display frames of the bitmap), it may be desirable to compensate for the decay factor applied to the bitmap, so as to reduce or minimize the effects of persistence to arrive at an accurate occupancy measurement. Accordingly, as indicated in the figure, the occupancy determination at step 136 may include persistence compensation. The following discussion and accompanying equations provide an example of such compensation.

For finite persistence, with a decay factor of r, the current hit value ($Y_{n-1}$)=hit count from current frame ($h_{n-1}$)+decayed hit value from previous frame ($rY_{n-2}$), or:

$$Y_{n-1}=h_{n-1}+rY_{n-2}.$$

Similarly, $Y_{n-2}$ is computed from the hit count from previous frame+decayed hit value from the frames previous to it:

$$Y_{n-2}=h_{n-2}+rY_{n-3}$$

Expanding this into a series yields: $Y_{n-1}=h_{n-1}+rh_{n-2}+r^2h_{n-3}+\ldots+r^nh_0$.

This can then be expressed as a formal series $$Y_{n-1} = \sum_{i=0}^{n-1} r^i h_{n-i}.$$

For signals which are present in every frame at a rate of α, the compensation for persistence effects should produce the same value of α after compensation/normalization. In other words, for some signal present 30% of the time, the occupancy readout should be 30% whether the user has no persistence, infinite persistence, or finite persistence.

$$Y_{n-1} = \sum_{i=0}^{n-1} r^i \alpha N$$

(recall N=number of transforms per frame);
αN is a constant and can be moved outside the summation:

$$Y_{n-1} = \alpha N \sum_{i=0}^{n-1} r^i.$$

The geometric series can be calculated in closed form $$\sum_{i=0}^{n-1} r^i = \frac{1-r^n}{1-r}.$$

Substituting the closed-form solution into the original series we get $$Y_{n-1} = \alpha N \left( \frac{1-r^n}{1-r} \right)$$

Recall, the occupancy value after compensation should still be α so the factor by which we multiply each frame is then $$\left( \frac{1-r}{1-r^n} \right) / N.$$

In other words, for a given hit count in a pixel of the bitmap, that hit count may be multiplied by $$\left( \frac{1-r}{1-r^n} \right)$$

to compensate for decay factor r being applied n times to the pixel/region in question. In a particular example, assume an accumulated hit value of 1000 at a given pixel, and that a decay factor of 0.25 had been applied 10,000 times to the pixel. Under this compensation example, the accumulated hit value of 1000 would be adjusted by a factor of $$\left( \frac{1-0.25}{1-0.25^{10,000}} \right),$$

or roughly 0.75. Thus for purposes of the occupancy measurement, the adjusted hit value for the pixel would be 0.75× 1000, or 750.

Using this normalization, the occupancy value for repetitive signals averages to the repetition rate of the signal. In other words, for a repetitive signal present 50% of the time, the compensation example above would yield an occupancy value that averages to the 50% repetition rate of the signal. For non-repetitive signals, the occupancy measurement result will eventually decay to zero. The reported occupancy value for this type of signal is affected by how long ago the signal occurred. More recent signals will have a higher value; less recent signals will have a lower value. Accordingly, the occupancy determination at step 136 may include a compensation for a decay factor or other persistence mechanism that causes historical signal events to persist in the bitmap database.

Figure 7:
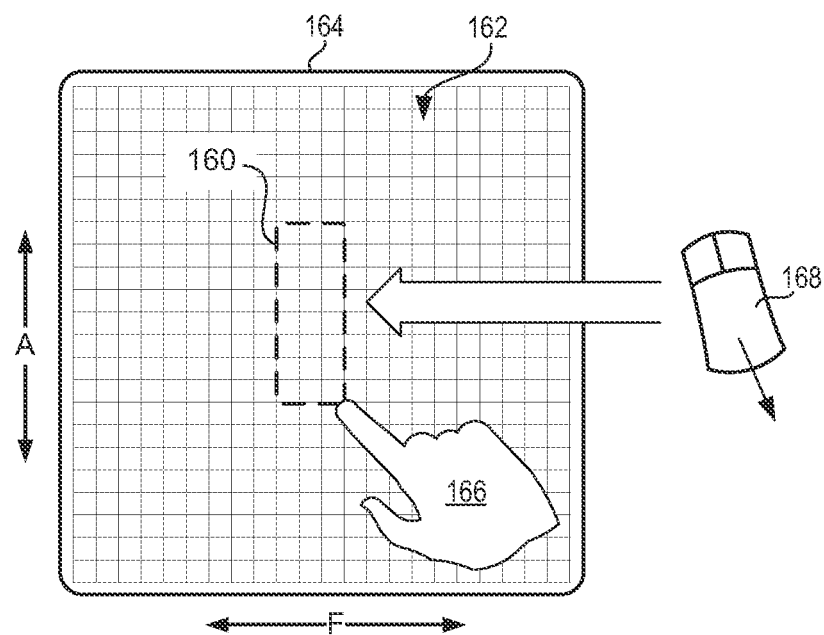
FIGS. 7-8 illustrate examples of selecting portions of a frequency domain bitmap, in order to specify regions in which signal characteristics are to be observed.
Figure 8:
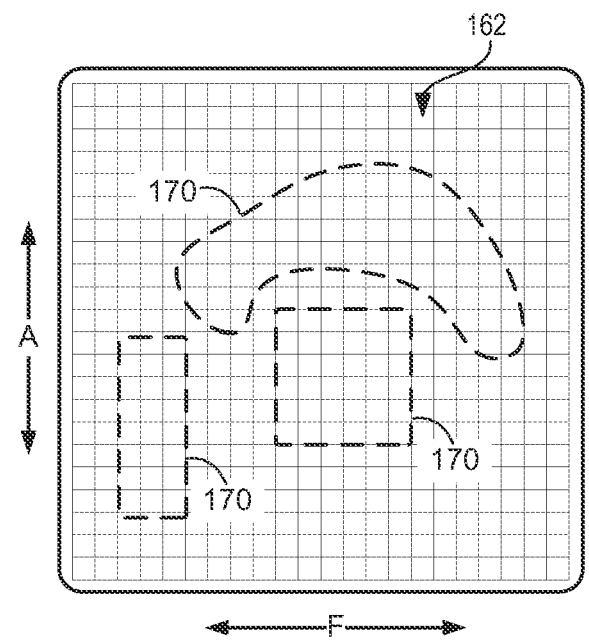

As discussed in prior examples, the selection of a desired portion of the bitmap (step 136) may occur in various ways. In one example, a user may use a keyboard to type in frequency and amplitude ranges for the area of interest. Another option is to use a pointing device to denote an area of interested with respect to a displayed version of the bitmap. FIG. 7 shows examples of use of a pointing device to select a portion 160 of bitmap 162 displayed on display 164. Display 164 may be an interactive touch sensitive display, such that the designation of the selected region may occur in response to a touch input from a user's hand 166. Another pointing-device approach includes receiving user input from a mouse 168 to designate the selected portion of the bitmap. These are but examples; a variety of other devices/mechanisms may be used to select portions of the bitmap. In addition, as seen in the example of FIG. 8, the selected portion of the bitmap may include multiple non-contiguous regions 170 of the bitmap 162, which may also include irregular shapes other than the rectilinear examples shown thus far.

Figure 9:
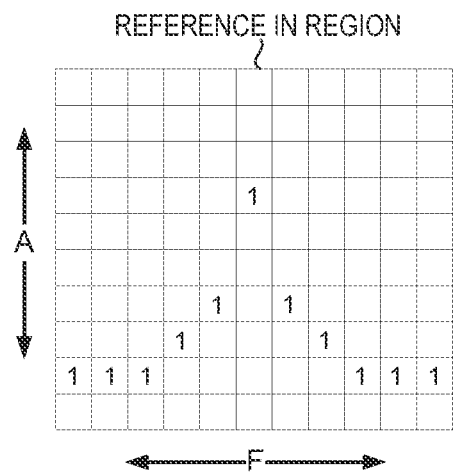
FIGS. 9-11 show exemplary frequency spectrum bitmaps with bitmap samples correlating variously to a reference signal event.
Figure 10:
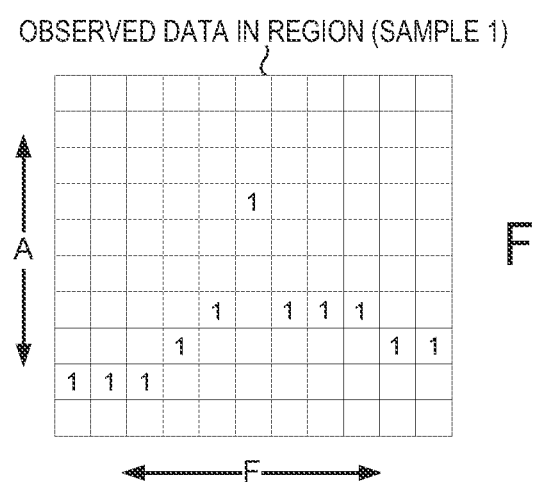
Figure 11:
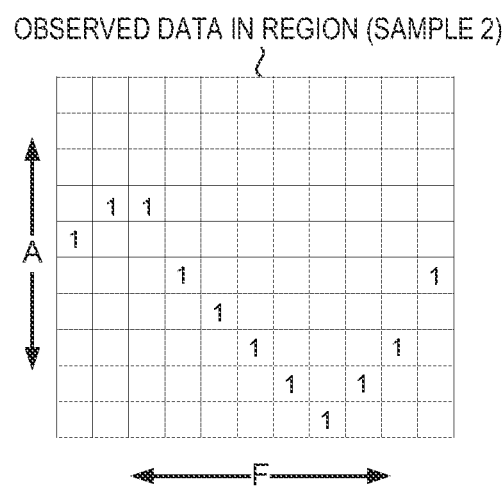

In addition to the above examples, triggering may be based on observing characteristics in the defined region of interest, and then determining the degree to which the observed characteristics correlate to a reference, such as a previously observed signal or signal event. Referring to FIGS. 9, 10 and 11, FIG. 9 shows a reference within a region of interest, while FIGS. 10 and 11 respectively show two different samples of collected spectrum data. Cursory inspection of the signal reveals that the sample of FIG. 10 more closely matches or correlates with the reference.

Various quantitative methods may be employed to assess the correlation of an observed bitmap region to a reference region. Generally, the bitmap region is updated, as in the example methods of FIGS. 4 and 6, and the correlation trigger is tested from time to time (e.g., once every display frame, or as often as after each transform). More particularly, during the testing step 92 of FIG. 4, a correlation score may be established for the collected data, where the score numerically reflects the degree to which the collected data correlates to the reference.

Referring again to FIG. 4, when correlation triggers are employed, the trigger definition at 82 may also include establishing or specifying a reference to be employed in the generation of correlation scores. In many cases, this will involve using previously obtained data, for example a reference bitmap, such as a digital phosphor bitmap, created from a portion of a time-varying signal known to be free of excessive noise or undesirable artifacts. On the other hand, the user might want to search for and diagnostically trigger upon a known spurious signal or artifact, in which case that would be supplied as the reference to the extent its characteristics were known.

The criteria-specifying in step 82 (FIG. 4) may also include the user specifying the amount of correlation between the observed signal and the reference that would trip the trigger. As previously indicated, correlation may be quantitatively measured in terms of a correlation score, and the trigger could thus be declared upon the correlation score exceeding a threshold value specified at step 82.

It will be appreciated that the reference for the correlation assessment may be obtained in a variety of ways. For example, the reference may be externally applied, in the sense that the reference is a predetermined signal phenomena obtained prior to the current data acquisition session. The external reference is supplied to the process for purposes of generating the trigger criteria. On the other hand, the reference may be internal, in the sense that it is generated or obtained from the transform and bitmap data being generated in the current data acquisition session. For example, the reference can simply be the accumulated (persisted) bitmap in the region of interest, so that a new signal that follows a path through the region of interest that has been followed many times before (and therefore has higher hit counts in the persisted display than a path less traveled) generates a trigger. In this case, there is no externally-supplied reference.

Furthermore, whether internal or external, the reference need not be taken from the region of interest that is specified for trigger testing. In some cases, a reference may be obtained from a different part of the bitmap than is being tested for the trigger criteria.

Figure 12:
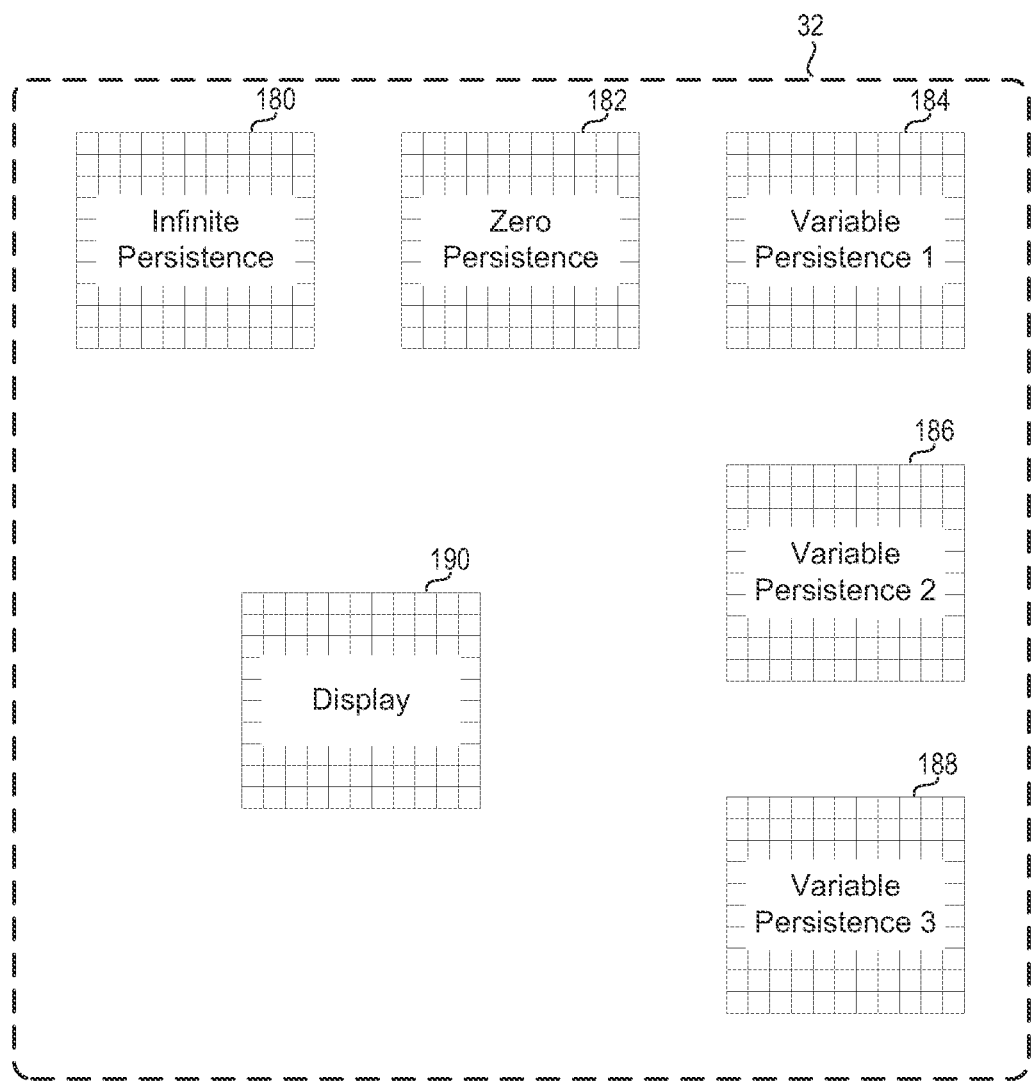
FIG. 12 is a schematic depiction of various bitmaps that may be employed in connection with the systems and methods of the present description.

In connection with the various exemplary systems and methods described above, it will be appreciated that multiple copies and/or versions of the bitmap data may be employed, for the purposes of trigger testing, implementing persistence, driving display output, etc. FIG. 12 depicts various illustrative examples of the bitmap structures, as stored in memory subsystem 32. As shown, bitmaps may be retained and updated to reflect infinite persistence 180, zero persistence 182 (i.e., the data from the most current transform or display frame of transforms), and various implementations of variable persistence 184, 186, 188. Furthermore, any or all of these data structures may be used to drive the actual display bitmap 190 that is read out to provide a displayable representation of the bitmap on display subsystem 34.

Triggering may also be performed based on hit counts occurring in the bitmap and/or in particular regions of interest on the bitmap. Hit count thresholds may be absolute counts, or relative to overall counts occurring in the bitmap, or counts occurring in particular regions of the bitmap. Furthermore, the density/occupancy and coloration triggers discussed herein may at times be expressed in terms of absolute or relative bitmap hit counts.

Figure 13:
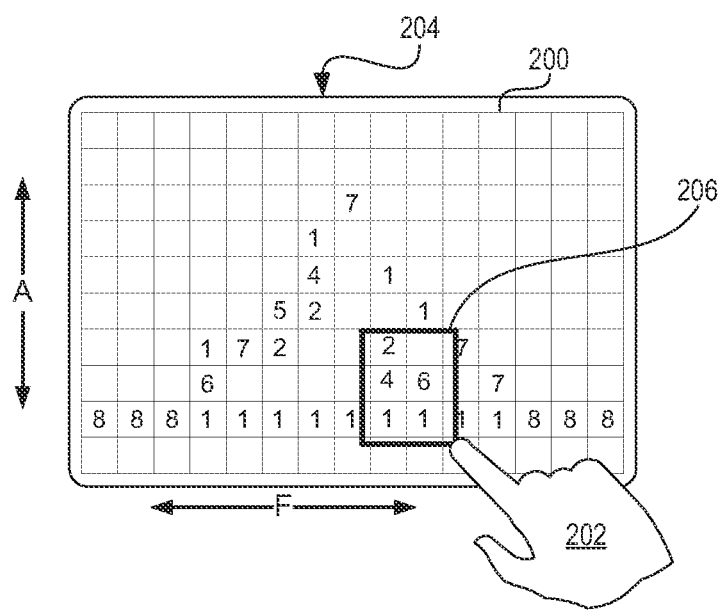
FIG. 13 shows a user interface system and method for creating frequency spectrum bitmap triggers.

As previously indicated in connection with step 82, the user specification of trigger criteria may in some cases be derived from a user input, as opposed to being directly specified. For example, referring to FIG. 13, the figure depicts a rendering of a bitmap 200 as presented to user 202 on a touch-sensitive interactive display 204. Referring to both FIG. 13 and steps 80 and 82 of FIG. 4, the depicted example provides a user interface which allows the user to intuitively indicate both the region of interest and the signal phenomena that is to be used to supply the trigger definition 82. In particular, user 202 is shown as making selection 206 by making a touch input with reference to the display.

Based on selection 206, processing instructions may be implemented (for example, within processing subsystem 36 of FIG. 1) in order to generate the region of interest and triggering criteria based on the user selection 206. One advantage of this approach is that it is intuitive for the user, and allows the user to gesture to a signal event (for example, from a past saved spectral image) that they wish to serve as the basis for a trigger. Then, in response to the bitmap data within the selection 206, the processor automatically translates the user input into trigger requirements by analyzing spectral data in the designated region of the bitmap. These trigger requirements may be expressed or broken down into a variety of trigger types, including the color, density, hit count and correlation triggers described above, and/or combinations thereof. In some embodiments, it will be desirable to scale or otherwise implement proportionality in connection with the characteristics that are identified in the user selection 146. For example, if the system determines a value for the signal density or occupancy in the selected region, it will at times be desirable to scale down the value if used for a triggering threshold, so as to be slightly over-inclusive in the declaration of trigger events. This may be considered a "sensitivity" of the trigger, and the user interface or device settings typically will also include mechanisms to enable user adjustment of this sensitivity.

It will be appreciated that the embodiments and example methods described herein may be implemented, for example, via computer-executable instructions or code, such as programs, stored on a computer-readable storage medium and executed by a computing device. In particular, and for example, the methods of FIG. 4 and FIG. 6 may be implemented via bitmap instructions or other instruction sets executable by a processing subsystem, such as the processing subsystem 36 shown in the exemplary frequency domain test and measurement device of FIG. 1. Generally, programs include routines, objects, components, data structures, and the like that perform particular tasks or implement particular abstract data types. As used herein, the term "program" may connote a single program or multiple programs acting in concert, and may be used to denote applications, services, or any other type or class of program. Likewise, the terms "computer" and "computing device" as used herein include any device that electronically executes one or more programs.

It will further be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of any of the above-described processes is not necessarily required to achieve the features and/or results of the embodiments described herein, but is provided for ease of illustration and description.

The subject matter of the present disclosure includes all novel and nonobvious combinations and subcombinations of the various processes, systems and configurations, and other features, functions, acts, and/or properties disclosed herein, as well as any and all equivalents thereof.

What is claimed is:

1. A method for triggering upon signal events in a frequency domain test and measurement device, comprising:
   repeatedly sampling a time-varying signal;
   generating, over time, a plurality of digital frequency domain spectrums based on sampling of the time-varying signal;
   repeatedly updating a frequency domain bitmap for the time-varying signal by sequentially applying the digital frequency domain spectrums to a data store containing the frequency domain bitmap, including:
   increasing hit counts in portions of the frequency domain bitmap when the digital frequency domain spectrums include components occurring within such portions of the frequency domain bitmap, and
   periodically decreasing accumulated hit counts in the frequency domain bitmap;
   selecting a portion of the frequency domain bitmap;

determining a signal occupancy within the portion of the frequency domain bitmap; and triggering a capture of the time-varying signal in response to the signal occupancy determined for the portion of the frequency domain bitmap.

2. The method of claim 1, further comprising displaying a displayed representation of the frequency domain bitmap, and where periodically decreasing accumulated hit counts in the frequency domain bitmap is performed using a decay factor which causes portions of the displayed representation to diminish over time if such portions are not increased via application of subsequent digital frequency domain spectrums to the data store.

3. The method of claim 2, where determining a signal occupancy within the portion of the frequency domain bitmap includes compensating for the decay factor used to periodically decrease the accumulated hit counts in the frequency domain bitmap.

4. The method of claim 3, where compensating for the decay factor includes multiplying a current hit count in the portion of the frequency domain bitmap by $$\left(\frac{1-r}{1-r^n}\right),$$

where r is the decay factor and where n is a number of times the decay factor has been applied to the portion of the frequency domain bitmap.

5. The method of claim 1, where determining the signal occupancy within the portion of the frequency domain bitmap includes:
  determining an amount of time during a measurement period that signal components occurred at frequency and amplitude values corresponding to the portion of the bitmap; and
  dividing the amount of time by a duration of the measurement period.

6. The method of claim 1, where determining a signal occupancy within the portion of the frequency domain bitmap includes:
  determining an actual number of hits occurring within the portion of the frequency domain bitmap during a measurement period; and
  dividing the actual number of hits by a maximum potential number of hits for the measurement period.

7. The method of claim 1, further comprising receiving a user input to specify the portion of the frequency domain bitmap which is selected.

8. The method of claim 7, where receiving the user input includes receiving input from a pointing device.

9. The method of claim 8, where the pointing device is a mouse.

10. The method of claim 8, where the pointing device is an interactive touchscreen display configured to display a displayed representation of the frequency domain bitmap.

11. The method of claim 1, where the portion of the frequency domain bitmap which is selected includes multiple non-contiguous regions of the frequency domain bitmap.

12. A system for triggering upon signal events occurring in frequency domain signals, comprising:
  a storage subsystem for storing a frequency domain bitmap of a time-varying signal, where the frequency domain bitmap is repeatedly updated by applying digital frequency domain spectrums to the frequency domain bitmap that are generated through repeated sampling of the time-varying signal;
  a processing subsystem operatively coupled with the storage subsystem; and
  bitmap instructions executable by the processing subsystem to:
    implement display persistence in the frequency domain bitmap by:
      increasing hit counts in portions of the frequency domain bitmap when the digital frequency domain spectrums which are applied to the frequency domain bitmap include components occurring within such portions of the frequency domain bitmap; and
      periodically decreasing accumulated hit counts in the frequency domain bitmap
    select a portion of the frequency domain bitmap;
    determine a signal occupancy within the portion of the frequency domain bitmap; and
    trigger a capture of the time-varying signal in response to the signal occupancy determined for the portion of the frequency domain bitmap.

13. The system of claim 12, where in determining the signal occupancy within the portion of the frequency domain bitmap, the bitmap instructions are configure to compensate for a decay factor used to periodically decrease the accumulated hit counts in the frequency domain bitmap.

14. The system of claim 13, where the bitmap instructions are configured to compensate for the decay factor by multiplying a current hit count in the portion of the frequency domain bitmap by $$\left(\frac{1-r}{1-r^n}\right),$$

where r is the decay factor and where n is a number of times the decay factor has been applied to the portion of the frequency domain bitmap.

15. The device of claim 12, where the bitmap instructions are configured to select the portion of the frequency domain bitmap in response to a user input.

16. The device of claim 12, where the portion of the frequency domain bitmap includes multiple non-contiguous regions of the frequency domain bitmap.

17. An frequency domain test and measurement device, comprising:
  a front end section for receiving a time-varying signal;
  a real-time engine operatively coupled with the front end section and configured to generate digital frequency domain spectrums based on the time-varying signal as the time-varying signal is received and processed through the front end section;
  a memory subsystem containing a frequency domain bitmap which is updated through sequential receipt and storage of the digital frequency domain spectrums;
  a display subsystem for displaying a displayable representation of the bitmap; and
  a processing subsystem configured to execute bitmap instructions which are operable to:
    implement display persistence for the displayable representation of the bitmap by periodically decreasing accumulated hit counts in the frequency domain bitmap, such that a transient signal event occurring in one display frame of the displayable representation is displayed but successively attenuated over one or more successive display frames;

select a portion of the frequency domain bitmap;

determine a signal occupancy within the portion of the frequency domain bitmap; and trigger a capture of the time-varying signal in response to the signal occupancy determined for the portion of the frequency domain bitmap.

18. The device of claim 17, where in determining the signal occupancy within the portion of the frequency domain bitmap, the bitmap instructions are configured to compensate for a decay factor used to periodically decrease the accumulated hit counts in the frequency domain bitmap.

19. The system of claim 18, where the bitmap instructions are configured to compensate for the decay factor by multiplying a current hit count in the portion of the frequency domain bitmap by $$\left(\frac{1-r}{1-r^n}\right),$$

where r is the decay factor and where n is a number of times the decay factor has been applied to the portion of the frequency domain bitmap.

* * * * *